(12) United States Patent
Kuo et al.

(10) Patent No.: US 6,511,882 B1
(45) Date of Patent: Jan. 28, 2003

(54) METHOD FOR PREVENTING THE LEAKAGE PATH IN EMBEDDED NON-VOLATILE MEMORY

(75) Inventors: Tung-Cheng Kuo, I-Lan (TW); Shou-Wei Hwang, Chilung (TW); Chien-Hung Liu, Taipei (TW); Shyi-Shuh Pan, Kaohsiung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/990,287

(22) Filed: Nov. 23, 2001

(51) Int. Cl.[7] .......................................... H01L 21/8247
(52) U.S. Cl. ...................................... 438/258; 438/592
(58) Field of Search ................................. 438/257–267, 438/592

(56) References Cited

U.S. PATENT DOCUMENTS

| | | | | |
|---|---|---|---|---|
| 5,346,842 A | * | 9/1994 | Bergemont | 365/185.16 |
| 5,935,875 A | * | 8/1999 | Lee | 438/737 |
| 6,127,224 A | * | 10/2000 | Pio | 257/318 |
| 6,162,675 A | * | 12/2000 | Hwang et al. | 257/365 |
| 6,194,267 B1 | * | 2/2001 | Kaya | 438/257 |
| 6,261,898 B1 | * | 7/2001 | Wu | 438/241 |
| 6,297,084 B1 | * | 10/2001 | Joung et al. | 438/238 |
| 6,326,669 B1 | * | 12/2001 | Hwang et al. | 257/384 |

* cited by examiner

Primary Examiner—Richard Booth

(57) ABSTRACT

A method for forming an embedded non-volatile memory is disclosed. The embedded non-volatile memory, comprises memory array and logic device area, is formed on a substrate where an oxide/nitride/oxide (ONO) layer on a memory array, a gate oxide layer on a logic device area. The method is that transistors of memory array and transistors of logic device area are formed by two separately photolithography processes. In memory array, the pitch between the poly gate electrodes is equivalent and has wider spacer width. In logic device area, the pitch between the poly gate electrodes is different and has suitable spacer width. According to above-mentioned, by using separated spacer width in memory array and logic device area can avoid the leakage path between bit line to bit line in subsequently self-aligned salicide process.

19 Claims, 9 Drawing Sheets

METHOD FOR PREVENTING THE LEAKAGE PATH IN EMBEDDED NON-VOLATILE MEMORY

BACKGROUND OF THE INVENTION

1. Field of the Invention

The present invention generally relates to a method for forming an embedded non-volatile memory, and more particularly to a method for forming a plurality of separated spacer width in an embedded non-volatile memory to prevent leakage current.

2. Description of the Prior Art

Typical semiconductor memory utilized during microprocessor operation is volatile. That is in the case of power interruption, the data stored in the semiconductor memory is typically completely lost. One way to circumvent this problem is to provide separate backup of the memory, such as battery power or capacitor storage. An alternate technique is to make the memory fundamentally non-volatile. This option is highly desirable because non-volatile semiconductor memories would not only withstand, power interruption, but also would be stored or shipped without being energized.

Non-volatile memory devices are important for providing an advantage that random access memory (RAM), both dynamic and static, can't be provided. That is, non-volatile memory devices do not lose their memory even the power is turned off. RAM enables information to be both stored and read to a memory cell as dictated by a microprocessor. Read-only memory (ROM) is the most popular variety of non-volatile memory devices.

However, the flash memory is electrically re-programmable for a limited number of times. This makes it ideal for those applications where only a few changes in the programming of the system is for either the entire memory array or for blocks of it.

Besides, memory storage exists not only as stand-alone memory device, but also embedded in processor chips. The performance of an embedded flash can be better than other flash since bandwidth problems are reduced and interface circuit and package leads are eliminated. It can also have characteristic tailored to the specific application rather than being a standardized comprises between many factors such as high operating speed.

Referring to FIG. 1A, the substrate 100 is divided into at least two a memory array 100a and a logic device area 100b. The conventional method for forming the first dielectric layer (tunneling oxide layer) 102a on the substrate 100 by thermal oxidation. However, the dielectric constant value of first 102a and second dielectric layer 102c is about 3.8 to 3.9 and thermal oxidation is a high temperature process. Then, a charge storage layer 102b such as silicon nitride (SiN) formed on the first dielectric layer 102a by conventional CVD method (chemical vapor deposition method). Next, a second dielectric layer 102c formed on the charge storage layer 102b by conventional CVD method. The material of first 102a and second dielectric layer 120c is silicon oxide. According to the hot electron injection phenomenon (HEI), some hot electrons penetrate through the bottom first dielectric layer 102a, especially when first dielectric layer 102a is thin enough, and electrons are therefore collected in charge storage layer 102b.

Referring to FIG. 1B and FIG. 1C, a photoresist layer is formed on the second dielectric layer 102c. Then, an etching process is to remove the second dielectric layer 102c, charge storage layer 102b, and first dielectric layer 102a on logic device area 100b. Then, a gate oxide layer 104 is formed on the logic device area 100b, after the photoresist layer is removed, and a polysilicon layer 106 is deposited on the memory array 100a and logic device area 100b. Next, a word line is defined on memory array 100a and another photoresist layer is formed on the polysilicon layer 106. Then, an etching process is performed on polysilicon layer 106 to form poly gate electrodes 106 on the memory array 100a and logic device area 100b simultaneously.

Referring to FIG. 1D, a silicon oxide is deposited to fill the pitch between the poly gate electrodes 106. Then, an etching back process is performed on the silicon oxide to form spacers 110 on sidewall of the poly gate electrodes 106. Then, a self-aligned silicide process is formed over the poly gate electrode 106.

Referring to FIG. 1E is a vertical view of the memory device. The horizontal lines connected to all the cells in the row are called word lines 112a, 112b, 112c, and 112d, and the vertical lines (along which data flows into and out of the cells are called bit lines 114a, 114b, 114c, and 114d. The dotted line 116 is crosscut the word line 112a, 112b, 112c, and 112d. Due to the thickness of oxide/nitride/oxide layer 102 is thinned; the salicide will pass through the oxide/nitride/oxide layer 102 to the substrate 100 in self-aligned salicide process such that the semiconductor device will not be operated.

The most obvious limiting factor for an embedded flash memory is the relevant fabrication. In conventional fabrication, the transistors of memory array and logic device area are formed simultaneously; therefore, the quality of transistors of both memory array and logic device area can't be optimized at the same time. In other words, either performance of any transistors of logic device area is degraded or reliability of any memory array is degraded.

SUMMARY OF THE INVENTION

It is an object of this invention to provide separated spacer width to create an effective oxide thickness that can avoid a conduction film formed from self-aligned silicide process between bit line to bit line.

It is another object of this invention to prevent the leakage path is between bit line to bit line in self-aligned silicide process.

It is still another object of this invention to provide a separated adjust photo condition of memory array and logic device area to get optimum process windows.

It is still another object of this invention to improve the photo condition process windows of the word line and complementary metal-oxide semiconductor (CMOS) poly gate electrode to prevent the leakage between the bit line to bit line.

In one embodiment, a substrate has a bit line structure and a plurality of isolation devices. The substrate is divided at least a memory array and a logic device area. The transistors of memory array are formed firstly and the pitch width between poly gate electrodes is equivalent in memory array. And then, the transistors of logic device area are formed and the pitch width between the poly gate electrodes is not equivalent in logic device area. By using separated adjust photo condition of memory array and logic device area to get optimum process window and using separated spacer width in memory array and logic device area to avoid the leakage path in self-aligned salicide process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
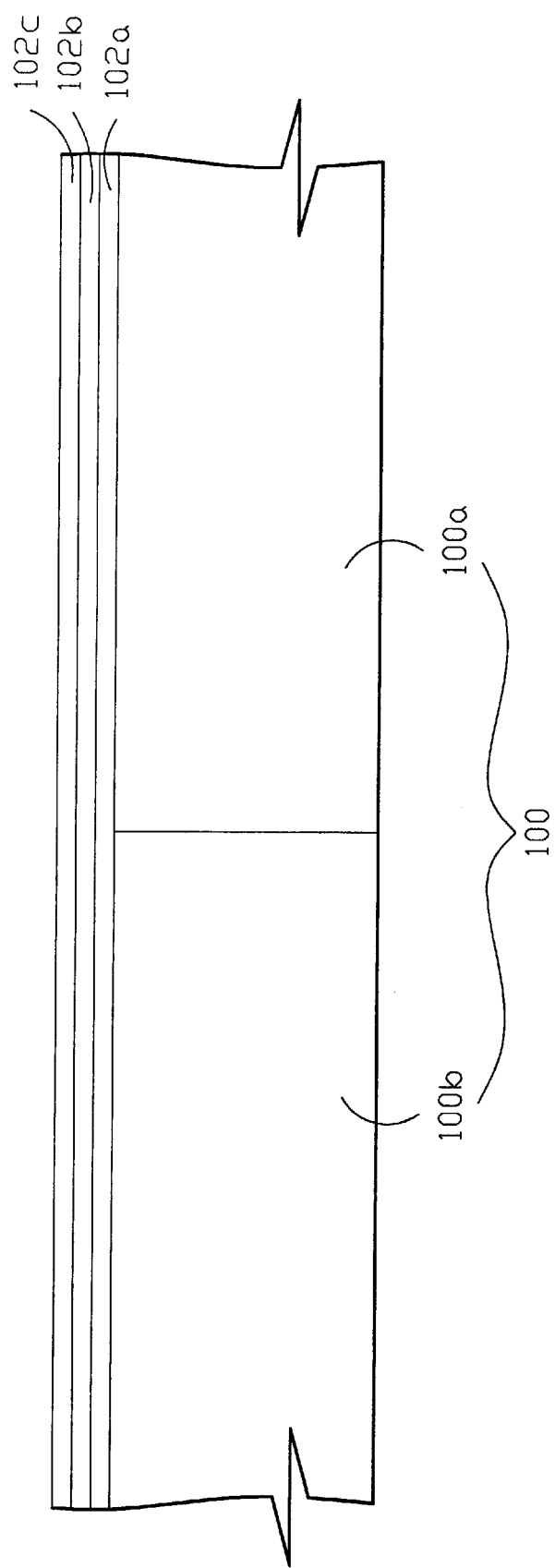
FIG. 1A is a schematic representation of structure of the gate dielectric layer on the substrate in accordance with the prior art.
Figure 1B:
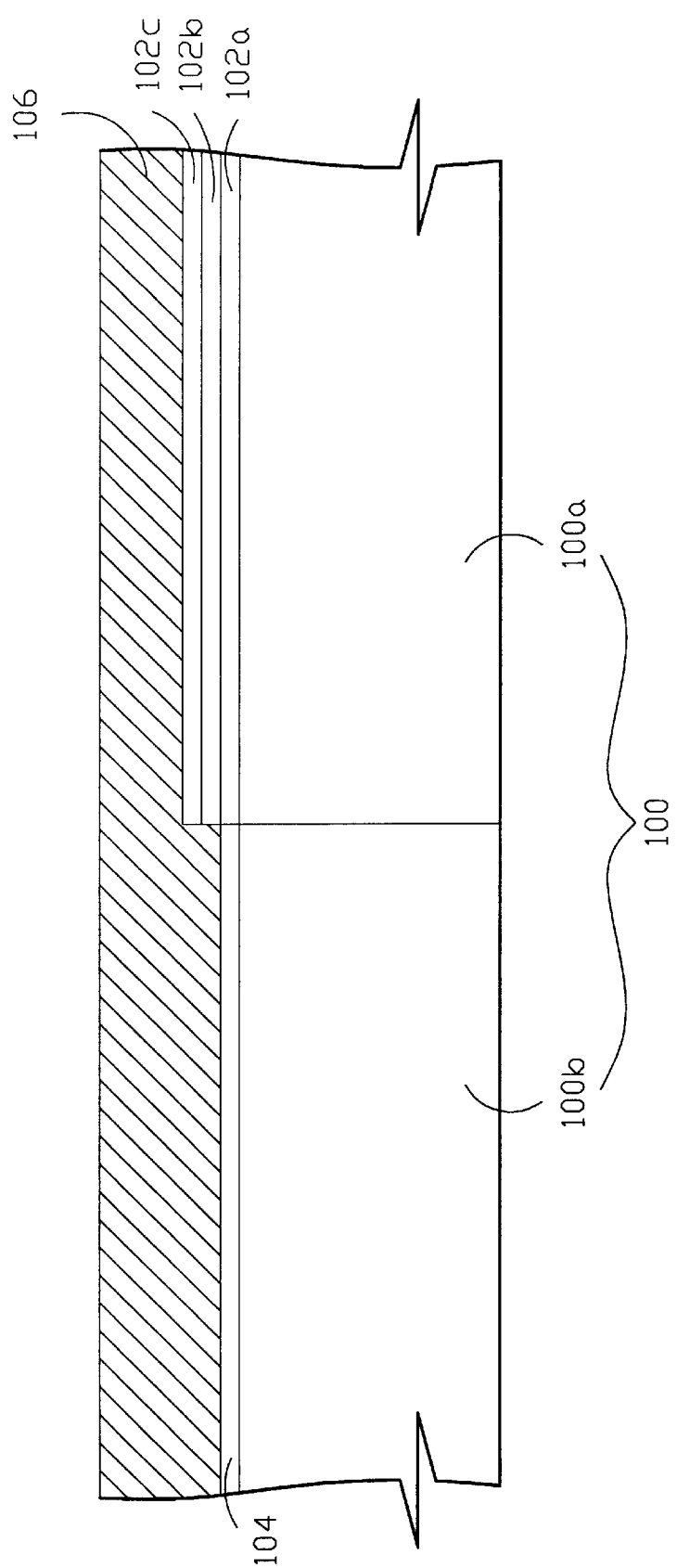
FIG. 1B is a schematic representation of structure of the gate oxide layer and a polysilicon layer on the substrate in accordance with the prior art.
Figure 1C:
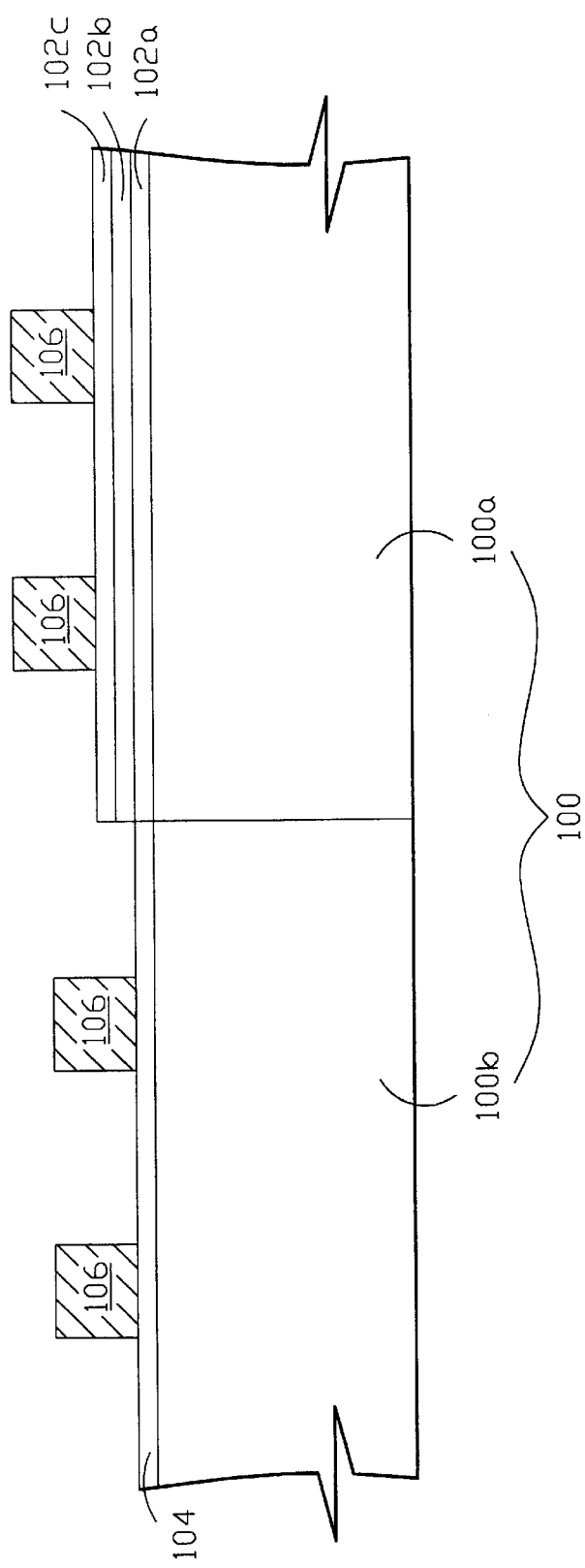
FIG. 1C is a schematic diagram for forming the poly gate electrode on the memory array and logic device area in accordance with the prior art.
Figure 1D:
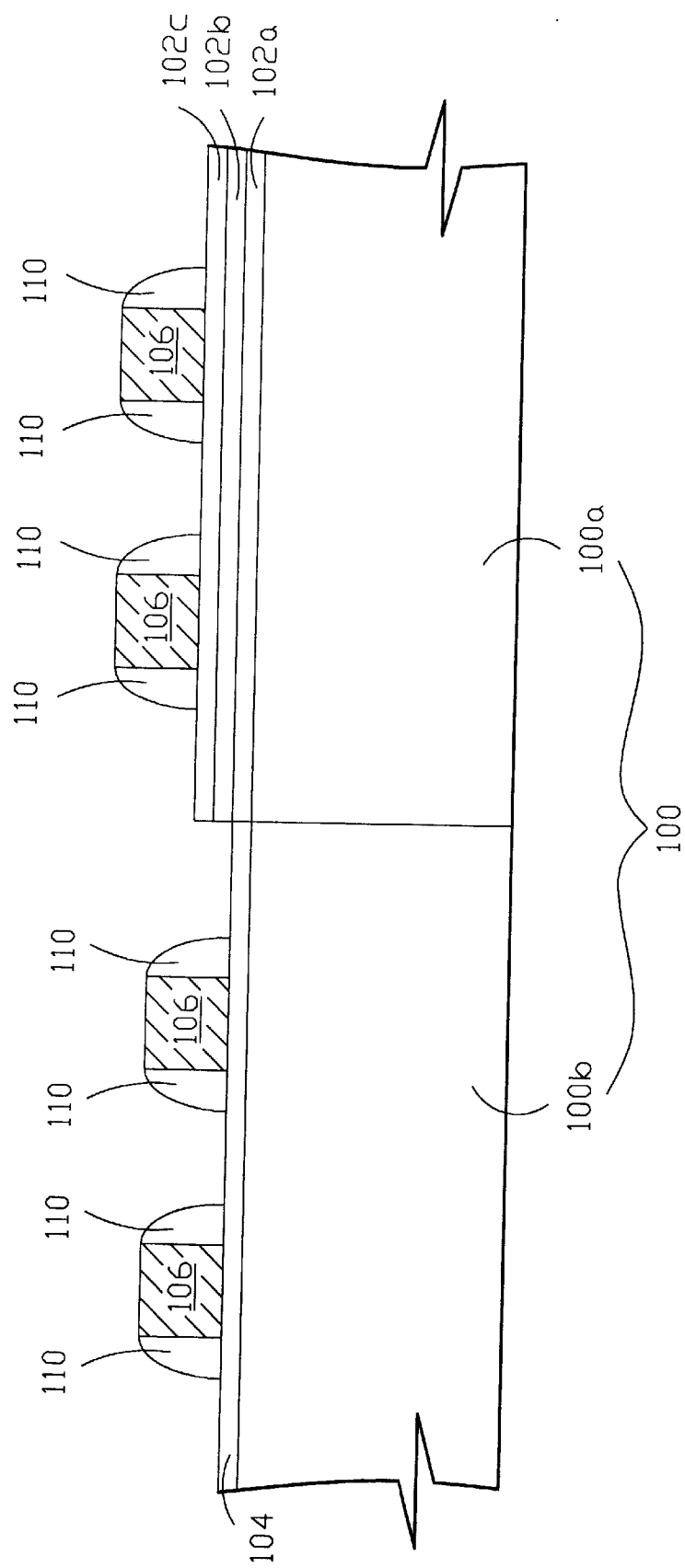
FIG. 1D is a schematic diagram for forming a memory device on the substrate in accordance with the prior art.
Figure 1E:
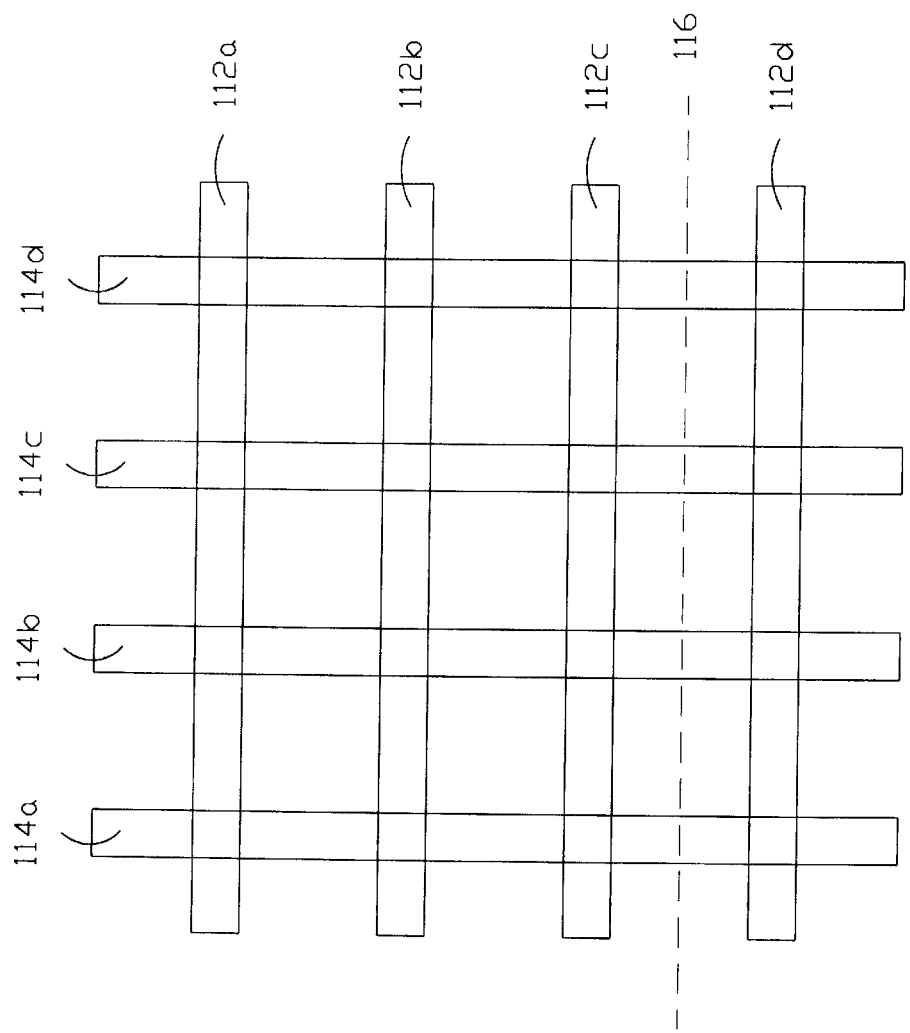
FIG. 1E is a schematic diagram of a vertical view of the memory device in accordance with the prior art.

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

The plurality of isolation devices is formed on a substrate 10 before the gate dielectric 12. The isolation device is used to separate the devices on memory array 10a and logic device area 10b and the substrate 10 is divided into at least two regions: the memory array 10a and the logic device area 10b, and the logic device area 10b is adjacent to the memory array 10a. The isolation devices are shallow trench isolation (STI) devices. For forming shallow trench isolation devices, a silicon nitride layer and a photoresist layer are subsequently formed on the substrate 10, and then a pattern of shallow trench isolation is pattern-transferred into the photoresist layer by the conventional method of photolithography. Next, using the photoresist layer as a mask, the silicon nitride layer is etched to transfer the pattern of the shallow trench isolation thereto. Following, the substrate 10 is etched to form a plurality of trench by using conventional etching methods. Next, a silicon oxide layer is filled into the trenches and oxidized by thermal oxidation followed by removing the photoresist layer and silicon nitride layer.

Then, a photoresist layer is deposited, exposed, and developed on the polysilicon layer 16 on memory array by the use of know photolithography techniques, where the photoresist layer is also covered on the polysilicon layer 16 of the logic device area 10b. Then, an etching process is performed on the polysilicon layer 16 to form poly gate electrodes 16a on memory array 10a.

Figure 2A:
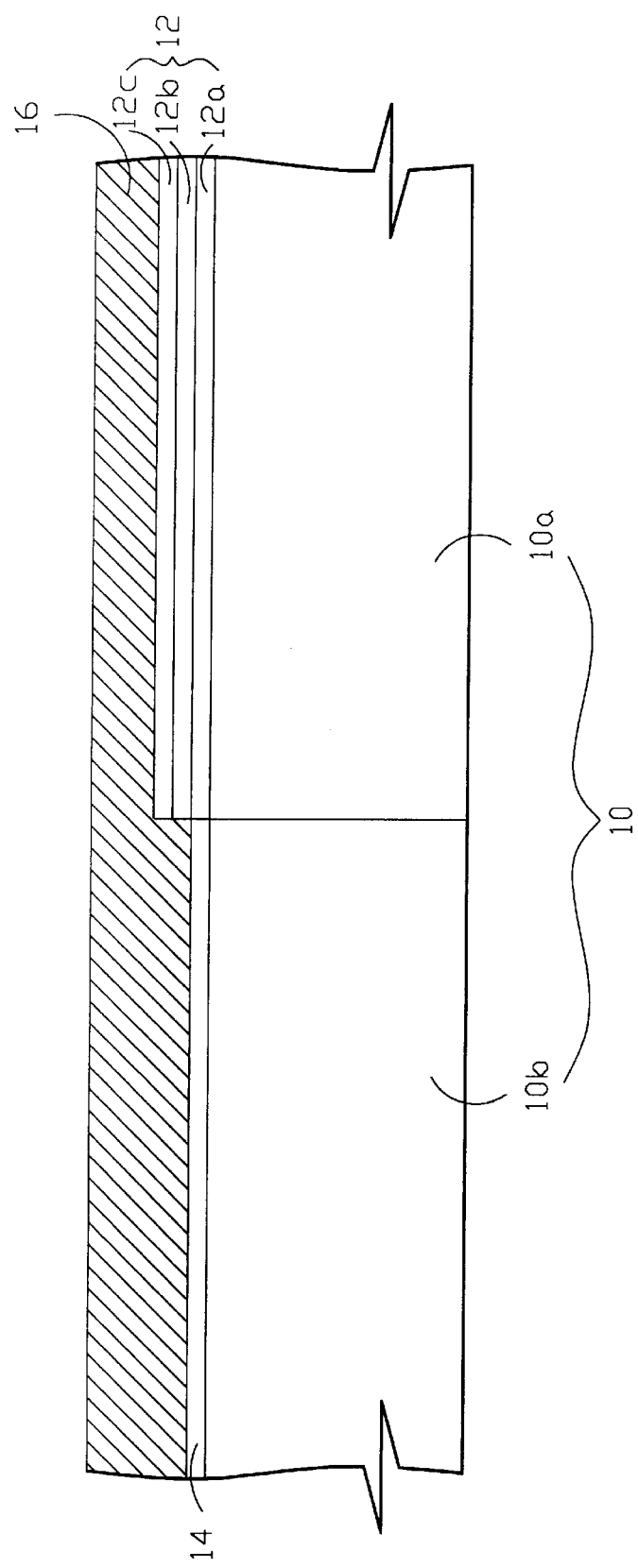
FIG. 2A is a schematic diagram for forming a gate dielectric layer, a gate oxide layer, and a polysilicon layer on the substrate in accordance with a method disclosed herein.

Referring to FIG. 2A, a word line structure is patterned to define on memory array 10a. The ONO (oxide/nitride/oxide) layer 12 with thickness about 200 angstroms is deposited to form nitride read-only memory (NROM). For the formation of the structure of ONO layer 12, a bottom-side silicon oxide layer 12a (tunneling oxide) as a first dielectric layer, a silicon nitride 12b as a charge storage layer, and a top-side silicon oxide layer 12c as a second dielectric layer are sequentially formed on the substrate 10. The silicon oxide layer 12a is formed by thermal oxidation, which is a high temperature process. The charge storage layer 12b is formed by conventional CVD (chemical vapor deposition) method. The charge storage layer 12b provides the charge retention mechanism for programming the memory cell, and then a second dielectric layer 12c is deposited on the charge storage layer 12b by conventional CVD method or by thermal oxidation method. Then, a bit line is defined on the memory array 10a. Then, the ONO layer 12 on logic device area 10b is removed by RIE process (reactive ion etching process) and a third dielectric layer serve as a gate oxide layer 14 is formed on the logic device area 10b by thermal oxidation. Then, the polysilicon layer 16 is formed on the memory array 10a and logic device area 10b.

Figure 2B:
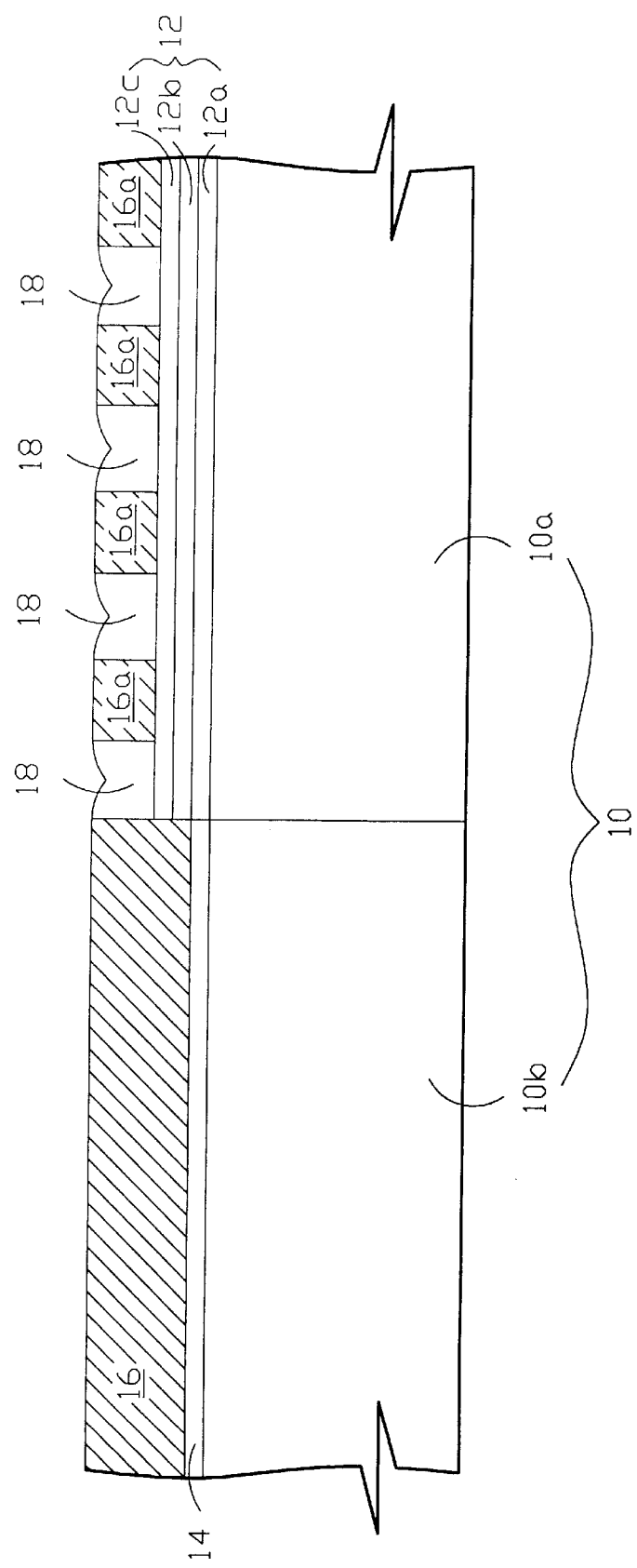
FIG. 2B is a schematic representation of structure of the formation of poly gate electrodes on memory array on the structure of FIG. 2A in accordance with a method disclosed herein.

Then, referring to FIG. 2B, a photolithography process is performed on polysilicon layer 16 and logic device area 10b is covered by photoresist layer. Then, an etching process is performed on the polysilicon layer 16 to form the poly gate electrode 16a on memory array 10a, wherein the pitch width between the poly gate electrodes 16a is equivalent and has wider spacers width to fill the oxide layer in subsequently process. After the poly gate electrodes 16a formed on memory array 10a, the photoresist layer on memory array 10a and logic device area 10b is removed.

Then, first spacers 18 are formed on sidewall of the poly gate electrodes 16a on memory array 10a. For forming the first spacers 18, an oxide layer is deposited to fill the plurality of pitch between the poly gate electrodes 16a on memory array 10a. Then, the oxide layer is etched back to form the first spacers 18 on sidewall of the poly gate electrodes 16a on ONO layer 12 on memory array 10a. To adjust the thickness of oxide layer to fill the spacer width between poly gate electrode 16a after etching back process.

Figure 2C:
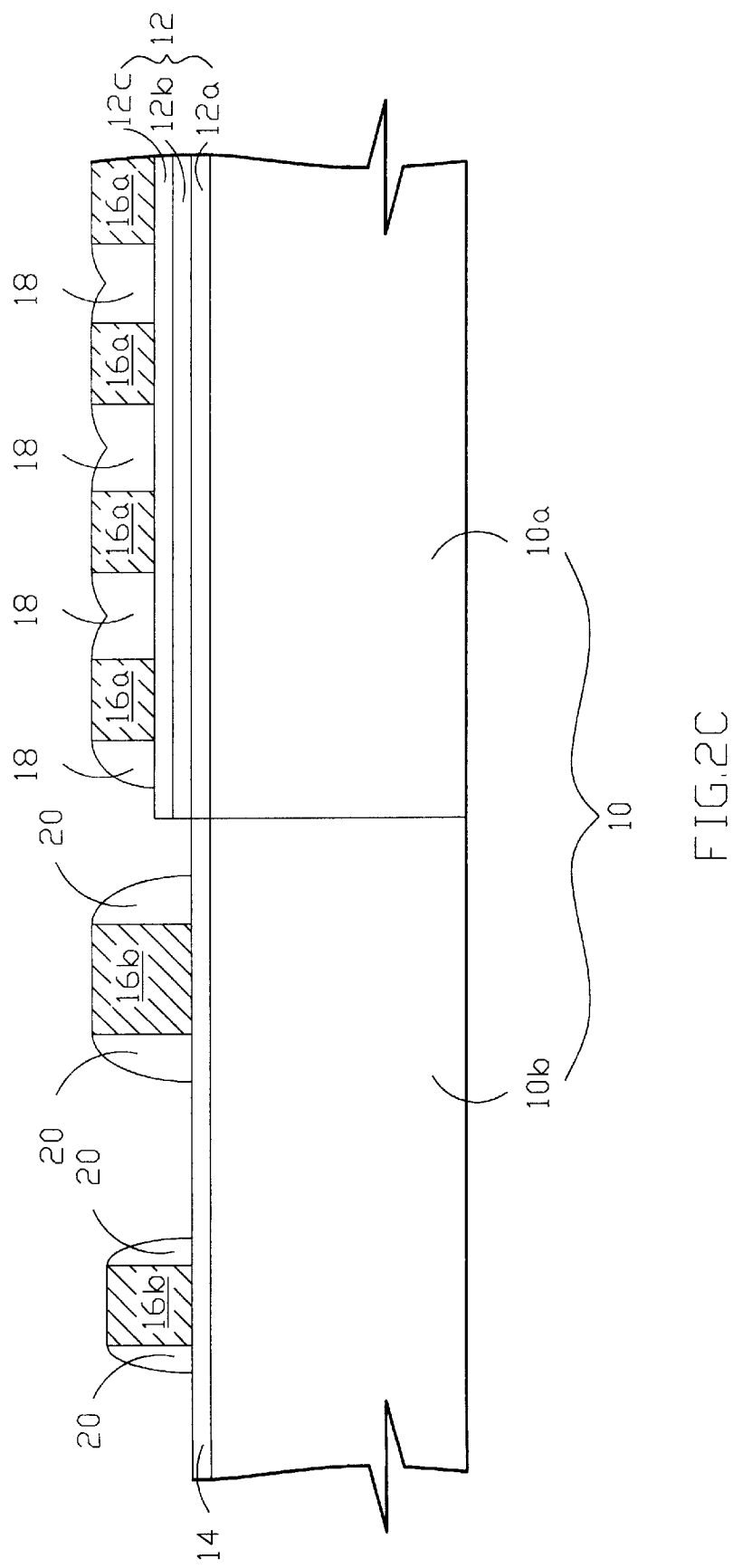
FIG. 2C is a schematic representation of structure of the formation of poly gate electrodes on logic device area on structure of FIG. 2B in accordance with a method disclosed herein.
Figure 2D:
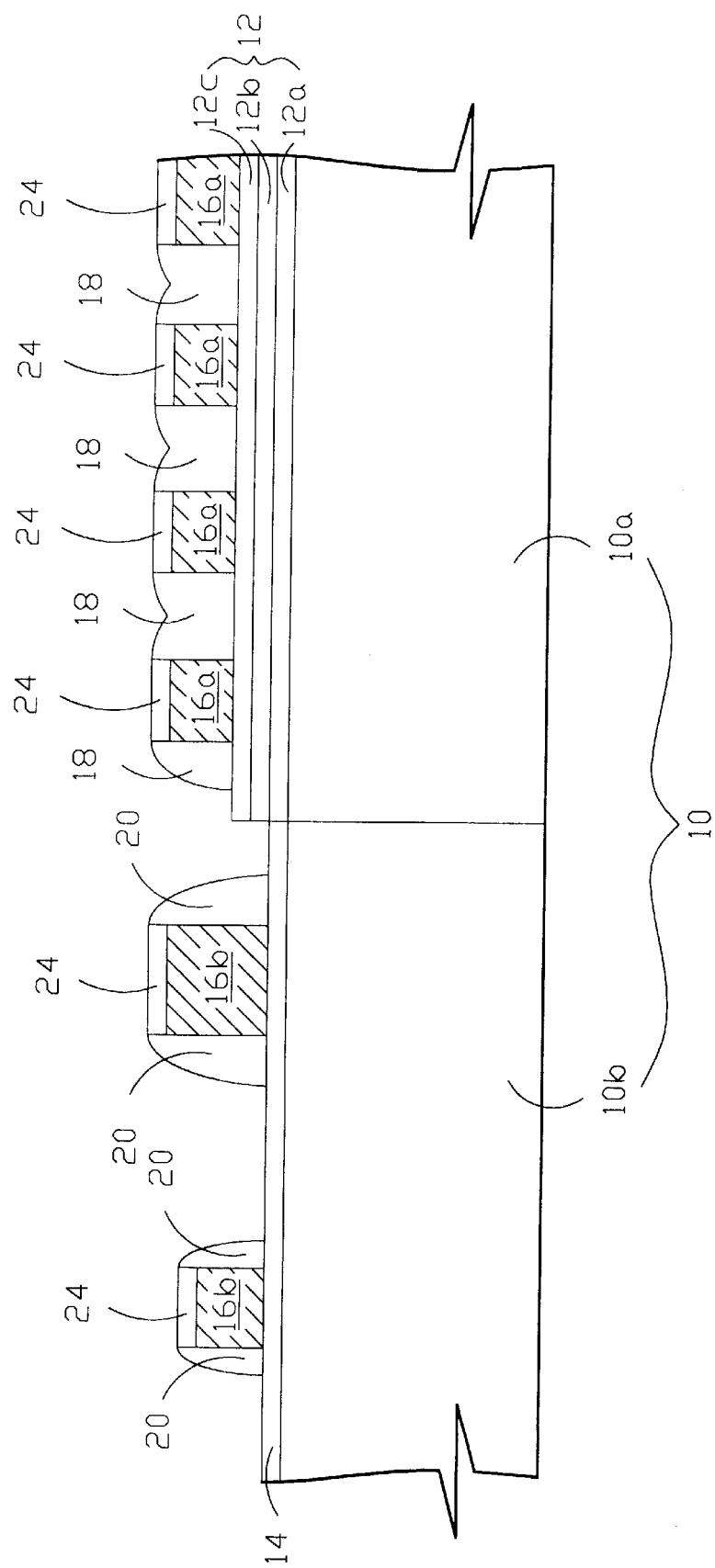
FIG. 2D is a schematic representation of the formation of transistor on memory array and logic device area of structure of FIG. 2C in accordance with a method disclosed herein.

Referring to FIG. 2C and FIG. 2D, a photolithography process is performed on the polysilicon layer 16 and memory array 10b is covered by photoresist layer. Then, an etching process is performed on polysilicon layer 16 to form the poly gate electrodes 16b on logic device area 10b, where the pitch between the poly gate electrodes 16b is not equivalent and has a suitable spacer width to fill the oxide layer in subsequently process on logic device area 10b. Next, the photoresist layer on memory array 10a and logic device area 10b is removed. Then, the lightly doped drain region is formed below the gate oxide layer 14 on logic device area 10b. Next, an etching back step is performed on the oxide layer to form the second spacers 20 on sidewall of the poly gate electrodes 16b on logic device area 10b. Thereafter, the source/drain regions are formed by conventional method of ion implantation into substrate 10. Finally, the salicide layer 24 is formed on memory array 10a and logic device area 10b by self-aligned silicide process.

According to above-mentioned description, the advantages for the present invention are the formation of transistors on memory array and logic device area is divided two photolithography processes. The DOF (depth of focus) and EL (exposure latitude) of word line and CMOS poly gate electrode are adjusted by two separately photo condition, and the photo condition process windows of word line and CMOS poly gate electrode are also can be enhanced to prevent the leakage between the bit line to bit line. Furthermore, the separated spacer width on memory array and logic device area can avoid the leakage path between bit line to bit line in self-aligned silicide process.

Although specific embodiments have been illustrated and described, it will be obvious to those skilled in the art that various modifications may be made without departing from what is intended to be limited solely by the appended claims.

What is claimed is:

1. A method for preventing leakage path in an embedded non-volatile memory and improving the photo condition process windows of a word line and a complementary metal-oxide semiconductor (CMOS) poly gate electrode, said method comprising:

providing a substrate having a memory array and a logic device area;

forming an oxide/nitride/oxide (ONO) layer on said memory array;

forming a dielectric layer on said logic device area;

depositing a polysilicon layer on said memory array and said logic device area;

patterning to etch said polysilicon layer to form a plurality of word lines on said memory array;

forming a spacer between said plurality of said word line to fill a pitch there between; and forming a metal-oxide-semiconductor transistor on said logic device area.

2. The method according to claim 1, wherein the step of forming said oxide/nitride/oxide (ONO) layer comprising:

forming said oxide/nitride/oxide (ONO) layer on said substrate; and removing said oxide/nitride/oxide (ONO) layer on said logic device area.

3. The method according to claim 2, wherein said oxide/nitride/oxide (ONO) layer comprises a first dielectric layer.

4. The method according to claim 3, further comprising a charge storage layer on said first dielectric layer.

5. The method according to claim 4, wherein the material of said charge storage layer comprises silicon nitride.

6. The method according to claim 5, further comprising a second dielectric layer on said charge storage layer.

7. The method according to claim 1, further comprising the step of forming a bit line after said step of said forming said oxide/nitride/oxide (ONO) layer.

8. A method for forming an embedded non-volatile memory, said method comprising:

providing a substrate having a memory array and a logic device area;

forming an oxide/nitride/oxide layer on said memory array;

forming a gate oxide layer on said logic device area;

depositing a polysilicon layer on said memory array and said logic device area;

patterning to etch said polysilicon layer to form a plurality of word lines on said memory array;

forming a first spacer between said plurality of said word lines to fill a pitch there between;

forming a metal-oxide-semiconductor transistor on said logic device area; and performing a self-aligned salicide process on said memory array and said logic device area.

9. The method according to claim 8, wherein the step of forming said oxide/nitride/oxide (ONO) layer comprising:

forming said oxide/nitride/oxide (ONO) layer on said substrate; and removing said oxide/nitride/oxide (ONO) layer on said logic device area.

10. The method according to claim 9, wherein said oxide/nitride/oxide (ONO) layer comprises a first dielectric layer.

11. The method according to claim 10, further comprising charge storage layer on said first dielectric layer.

12. The method according to claim 11, wherein the material of said charge storage layer comprises silicon nitride.

13. The method according to claim 12, further comprising a second dielectric layer on said charge storage layer.

14. The method according to claim 8, further comprising the step of forming a bit line after said step of said forming said oxide/nitride/oxide (ONO) layer on said memory array.

15. The method according to claim 8, wherein said metal-oxide semiconductor transistor comprises a poly gate electrode on said gate oxide layer, and a second spacer on sidewall of said poly gate electrode.

16. A method for forming an embedded non-volatile memory, said method comprising:

providing a substrate having a memory array and a logic device area;

sequentially depositing a first dielectric layer on said substrate, a charge storage layer on said first dielectric layer, and a second dielectric layer on said charge storage layer;

removing said first dielectric layer, said charge storage layer, and said second dielectric layer on said logic device area;

forming a third dielectric layer on said logic device area;

depositing a polysilicon layer on said memory array and said logic device area;

patterning to etch said polysilicon layer to form a plurality of word lines on said memory array;

forming a first spacer between said plurality of said word lines to fill pitch there between; and patterning to etch said polysilicon layer to form a poly gate electrode on said logic device area;

forming a lightly doped drain region on said logic device area;

forming a second spacer between said poly gate electrodes on said logic device area;

forming a source/drain region adjacent said lightly doped drain region; and performing a self-aligned salicide process on said memory array and said logic device area.

17. The method according to claim 16, wherein the material of said first dielectric layer, said second dielectric layer, and said third dielectric layer comprises silicon oxide.

18. The method according to claim 17, wherein the material of said charge storage layer comprises silicon nitride.

19. The method according to claim 16, further comprising the step of forming a bit line after said step of said sequentially depositing.

* * * * *